United States Patent [19]

Tomiyama et al.

[11] Patent Number: 5,772,040
[45] Date of Patent: Jun. 30, 1998

[54] WORKPIECE CONVEYING APPARATUS USED WITH WORKPIECE INSPECTION DEVICE

[75] Inventors: Hiromi Tomiyama, Musashimurayama; Yoshiyuki Ogata, Fussa; Satoshi Enokido, Tachikawa; Takeyuki Nakagawa, Akishima, all of Japan

[73] Assignee: Kabushiki Kaisha Shinkawa, Tokyo, Japan

[21] Appl. No.: 533,685

[22] Filed: Sep. 26, 1995

[30] Foreign Application Priority Data

Sep. 27, 1994 [JP] Japan .................................. 6-256032

[51] Int. Cl.⁶ .................................................. B07C 5/02
[52] U.S. Cl. .......................... 209/3.3; 209/571; 209/573; 209/587; 209/922; 209/939
[58] Field of Search .................................. 209/571, 573, 209/576, 577, 587, 922, 939, 3.3

[56] References Cited

U.S. PATENT DOCUMENTS

| | | |
|---|---|---|
| 3,623,603 | 11/1971 | Casner et al. ............................. 209/3.3 |
| 4,304,981 | 12/1981 | Gappa ................................... 209/3.3 X |
| 4,746,020 | 5/1988 | Schenk .................................... 209/3.3 |
| 4,851,902 | 7/1989 | Tezuka et al. ....................... 209/577 X |
| 4,908,126 | 3/1990 | Willberg et al. ......................... 209/573 |
| 4,926,118 | 5/1990 | O'Connor et al. .................. 209/573 X |
| 5,150,797 | 9/1992 | Shibata ................................... 209/573 |
| 5,168,218 | 12/1992 | Rich ................................... 209/573 X |
| 5,347,362 | 9/1994 | Sugawara . |

FOREIGN PATENT DOCUMENTS 3906281   10/1989   Germany ............................... 209/577

*Primary Examiner*—David H. Bollinger
*Attorney, Agent, or Firm*—Koda & Androlia

[57] ABSTRACT

Workpieces in which, for example, wire bonding has been performed are inspected to determine if they are defective or not by an inspection device. Workpieces which have been found to be defective are conveyed to one workpiece magazine and workpieces which have been found to be defect-free are conveyed to another workpiece magazine, thus defective and non-defective workpieces are separated immediately after inspection.

2 Claims, 4 Drawing Sheets

WORKPIECE CONVEYING APPARATUS USED WITH WORKPIECE INSPECTION DEVICE

BACKGROUND OF THE INVENTION

1. Field of the Invention

The present invention relates to a workpiece conveying method and workpiece conveying apparatus used with a workpiece inspection device which inspects workpieces upon which necessary processing such as wire bonding has been performed.

2. Prior Art

The device described in U.S. Pat. No. 5,347,362 which corresponds to Japanese Patent Application Laid-Open (Kokai) No. 5-160233 is an example of a conventional inspection device for inspecting bonded wires. The schematic construction of this device is shown in FIG. 4.

In this device, a workpiece 6 to which wires 5 are bonded so that said wires 5 connect the pads 2 of a semiconductor chip 1 to the leads 4 of a lead frame 3 is placed on an inspection stand 7. An illuminating means 11 mounted to the lower part of an optical system 12 is positioned above the workpiece 6 placed on the inspection stand 7. An imaging device 14 such as a CCD (photoelectric transducer element) camera, etc. is mounted to the upper part of the optical system 12 with a diaphragm means 13 in between. The optical system 12 which includes lenses and prisms and to which the illuminating means 11 and imaging device 14 are mounted is attached to a supporting block 16 which is fastened to the upper surface of an XY table 15. The optical system 12 is driven up and down by a Z-axis motor 17.

With such a wire inspection device 10 as shown in FIG. 4, the positional shifts of the ball bonded to a first bonding point, the diameter of the ball, positional shifts of the crescent bonded to a second bonding point, the width and length of the crescent, the height and bend of the wire, and other factors of bonded wires are inspected.

FIG. 5 shows an example of a workpiece conveying apparatus that uses such a wire inspection device 10 as described above. The respective sides of the wire inspection device 10 constitute a workpiece loader side 20 and a workpiece unloader side 30. A loader-side magazine 21 in which workpieces that are to be inspected are accommodated at a fixed pitch in the vertical direction is installed on the loader side 20, and an unloader-side magazine 31 which accommodates workpieces that have been inspected is installed on the unloader side 30. The loader-side magazine 21 and the unloader-side magazine 31 are provided on respective elevators (not shown), and these elevators are respectively raised and lowered one pitch at a time by a loader-side motor 22 and by an unloader-side motor 32. Furthermore, a loader-side pusher 23 for pushing the workpieces out of the loader-side magazine 21 is installed on the loader side 20. In addition, a workpiece feeder 40 is installed between the loader-side magazine 21 and unloader-side magazine 31 so as to convey the workpieces that are to be inspected onto the inspection stand 7 and further conveys the workpieces that have been inspected from said inspection stand 7. In FIG. 5, the reference numeral 41 indicates a marking unit.

Workpieces are fed in the following manner: each workpiece that is to be inspected is pushed out onto the workpiece feeder 40 from the loader-side magazine 21 by the pusher 23 and is fed to and positioned on the inspection stand 7 by the workpiece feeder 40. The positional shifts of the bonding points, for example, in one device part of the workpiece are inspected by the wire inspection device 10. When the inspection is completed, the workpiece is moved by the workpiece feeder 40 so that the next device part of the workpiece 6 is positioned in the inspection position that is beneath the inspection device 10 and then inspected.

If an inspected device part is found to be defective, the device part is marked with a "defective" marking by the marking unit 41 when such a device part is positioned beneath the marking unit 41. Then, when all of the device parts of the workpiece are inspected, the workpiece is fed out of the workpiece feeder 40. Conveying the workpiece out of the magazine 21 is accomplished by one of the following two methods:

a. The first conveying method is a standard type. In this method, each workpiece which has been inspected is fed to the unloader side 30 and accommodated in the unloader-side magazine 31. Each time a workpiece is pushed out from the loader-side magazine 21, the loader-side magazine 21 is lowered one pitch by the loader-side motor 22, so that the next workpiece 6 inside the loader-side magazine 21 is positioned at the conveying level; and each time a workpiece is fed into a workpiece accommodation section of the unloader-side magazine 31, the unloader-side magazine 31 is lowered one pitch by the unloader-side motor 32, so that the next workpiece accommodation section is positioned at the conveying level.

b. The second conveying method is a return type. In this method, only the loader-side magazine 21 is used, and the unloader-side magazine 31 is not used. In other words, each workpiece fed out of the loader-side magazine 21 is inspected and then fed back to the loader side 20 by the workpiece feeder 40, and the inspected workpiece is again accommodated in the loader-side magazine 21. In this type of workpiece conveyance, after each workpiece to be inspected has been pushed out of the loader-side magazine 21, the magazine 21 is not raised or lowered until the workpiece is inspected and conveyed back into the loader-side magazine 21. When the accommodation is completed, then the loader-side magazine 21 is lowered one pitch by the loader-side motor 22.

In workpiece inspections, generally the workpieces are controlled in lots, and respective ID numbers, etc. are assigned to the individual magazines 21 and 31 so that production control is performed based upon such ID numbers. Accordingly, in the method in which the workpieces inspected are accommodated in the unloader-side magazine 31 as in the first conveying type described above, the workpieces 6 are accommodated in different magazines 21 and 31 before and after the inspection. Accordingly, the magazine registration of the workpieces must be changed. On the other hand, in the method in which the inspected workpieces are accommodated back into the original loader-side magazine 21, there is no need for a change in magazine registration, since there is no change of magazines.

However, in either of the two conveying types described above, if workpieces 6 which are marked "defective" are sent into a subsequent process, it is necessary to detect the "defective" markings so as to separate the defective workpieces from defect-free workpieces in the subsequent process. Recently, however, there has been an increased demand for performing the subsequent processes without performing detection nor separation of the defective and defect-free workpieces after the inspection. Accordingly, the elimination of such detection and separation steps of defective and defect-free workpieces in subsequent processes has become an increasing demand. Meanwhile, production lines in which the users of the above-described wire detection apparatus have become diversified with various configurations. Accordingly, there is a need for flexibility so that the inspection apparatus can be used in such diversified production lines.

SUMMARY OF THE INVENTION

Accordingly, it is a first object of the present invention to provide a workpiece conveying method and workpiece conveying means in a workpiece inspection apparatus which requires no detection and separation steps of defective and defect-free workpieces in subsequent processes in the prior art.

It is a second object of the present invention to provide a workpiece conveying method and workpiece conveying device in a workpiece inspection apparatus which have flexibility so that the inspection apparatus can be used in any of different production lines.

The objects, particularly the first object, of the present invention is accomplished by a unique method that uses: a workpiece inspection device which inspects bonded workpieces, a loader-side magazine and an unloader-side magazine which are respectively installed on either side of the workpiece inspection device and moved up and down by elevators, and a workpiece feeder installed between the loader-side magazine and unloader-side magazine so as to convey workpieces to and from the inspection position of the workpiece inspection device, and the unique method of the present invention is characterized in that workpieces accommodated in the loader-side magazine are fed to the inspection position and inspected by the workpiece inspection device, and workpieces found to be free of defects are fed back into the loader-side magazine, while only the workpieces found to be defective are fed into the unloader-side magazine.

The above two objects of the present invention are accomplished by a further unique method that uses: a workpiece inspection device which inspects bonded workpieces, a loader-side magazine and an unloader-side magazine which are respectively installed on either side of the workpiece inspection device and moved up and down by elevators, and a workpiece feeder which is installed between the loader-side magazine and the unloader-side magazine so as to convey workpieces to and from the inspection position of the workpiece inspection device, and the unique method of the present invention is characterized in that the workpieces can be fed in three different types which include: a standard type in which workpieces accommodated in the loader-side magazine are fed to the inspection position and inspected by the inspection device, workpieces found to be defective are marked with a "defective" mark, and all of the inspected workpieces are accommodated into the unloader-side magazine; a return type in which all of the inspected workpieces are accommodated back in the loader-side magazine, and a discriminating type in which workpieces free of defects are accommodated back in the original loader-side magazine, while defective workpieces are accommodated in the unloader-side magazine, and any of these three conveying types can be selected as desired.

Furthermore, the object, particularly the first object, is accomplished by a unique structure for a workpiece inspection apparatus which includes: a workpiece inspection device which inspects bonded workpieces, a loader-side magazine and an unloader-side magazine which are respectively installed on either side of the workpiece inspection device and moved up and down by elevators, and a workpiece feeder which is installed between the loader-side magazine and unloader-side magazine so as to convey workpieces to and from the inspection position of the workpiece inspection device, and the unique structure of the present invention is characterized in that the workpiece inspection apparatus further includes: a conveying control memory and an arithmetic unit in which the conveying control memory stores a control procedure for discriminating type conveyance of the workpieces in which workpieces that have been found by the inspection device to be free of defects are returned to the loader-side magazine and accommodated in the magazine, while only workpieces found to be defective are fed to and accommodated in the unloader-side magazine, and the arithmetic unit controls the components of the loader side, unloader side and workpiece feeder in accordance with the control procedure of the conveying control memory.

The above described two objects of the present invention are accomplished by a further unique structure for an inspection apparatus which includes: a workpiece inspection device which inspects bonded workpieces, a loader-side magazine and an unloader-side magazine which are respectively installed on either side of the workpiece inspection device and moved up and down by elevators, and a workpiece feeder which is installed between the loader-side magazine and unloader-side magazine so as to convey workpieces to and from the inspection position of the workpiece inspection device, and the unique structure of the present invention is characterized in that the workpiece inspection apparatus further includes: a conveying control memory and an arithmetic unit in which the conveying control memory stores three different types of control procedures which comprise a standard type conveyance procedure in which all of the inspected workpieces are accommodated in the unloader-side magazine, a return type conveyance procedure in which all of the inspected workpieces are accommodated back in the loader-side magazine, and a discriminating type conveyance procedure in which workpieces free of defects are returned to and accommodated in the loader-side magazine, while defective workpieces are accommodated in the unloader-side magazine, and the arithmetic unit controls components of the loader side, unloader side and workpiece feeder in accordance with a control procedure selected from the three types of control procedures stored in the conveying control memory.

In the present invention, inspected workpieces which are free of defects are fed to and accommodated in the loader-side magazine, while defective workpieces are fed back to and accommodated in the unloader-side magazine. Accordingly, there is no need for a change in magazine registration; and in addition, there is no need to separate defective workpieces in subsequent processes.

Furthermore, in the present invention, one of three different types of workpiece conveying types can be selected as desired; i. e., a standard type in which workpieces that have been inspected are all accommodated in the unloader-side magazine, a return type in which workpieces inspected are returned to the loader-side magazine, and a discriminating type in which workpieces free of defects are returned to the loader-side magazine, while defective workpieces are accommodated in the unloader-side magazine.

In view of the above structure and function, the workpiece inspection method and apparatus of the present invention can eliminate determination of defect and defect-free workpieces in the subsequent process and can be used in any production line that includes a workpiece inspection process.

DETAILED DESCRIPTION OF THE INVENTION

One embodiment of the present invention will be described with reference to FIGS. 1 through 4 below.

Figure 1:
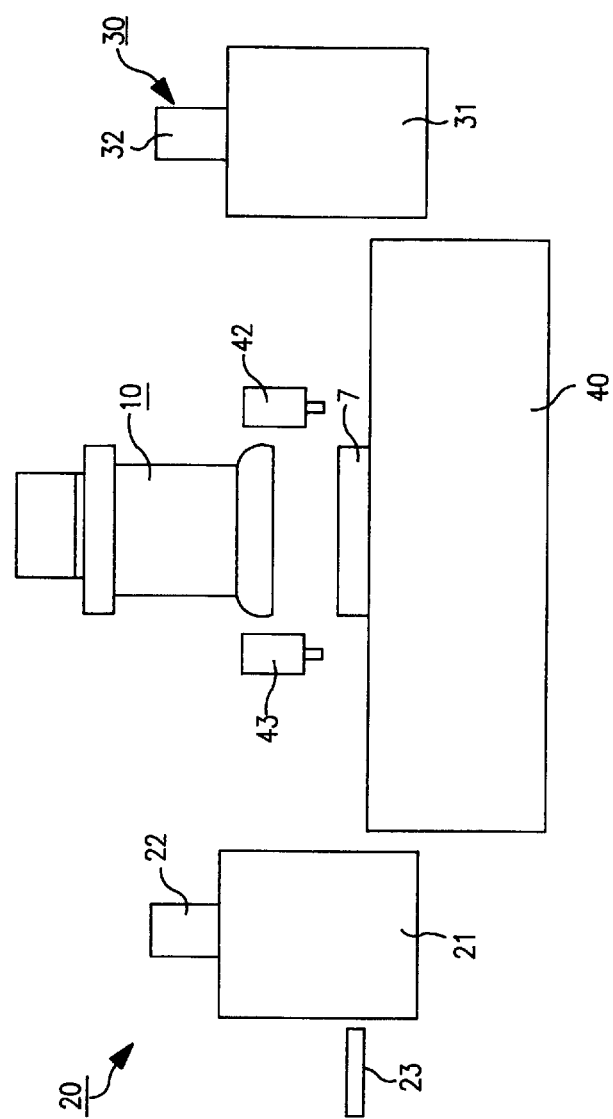
FIG. 1 is a front view of one embodiment of the workpiece inspection apparatus in the present invention.
Figure 5:
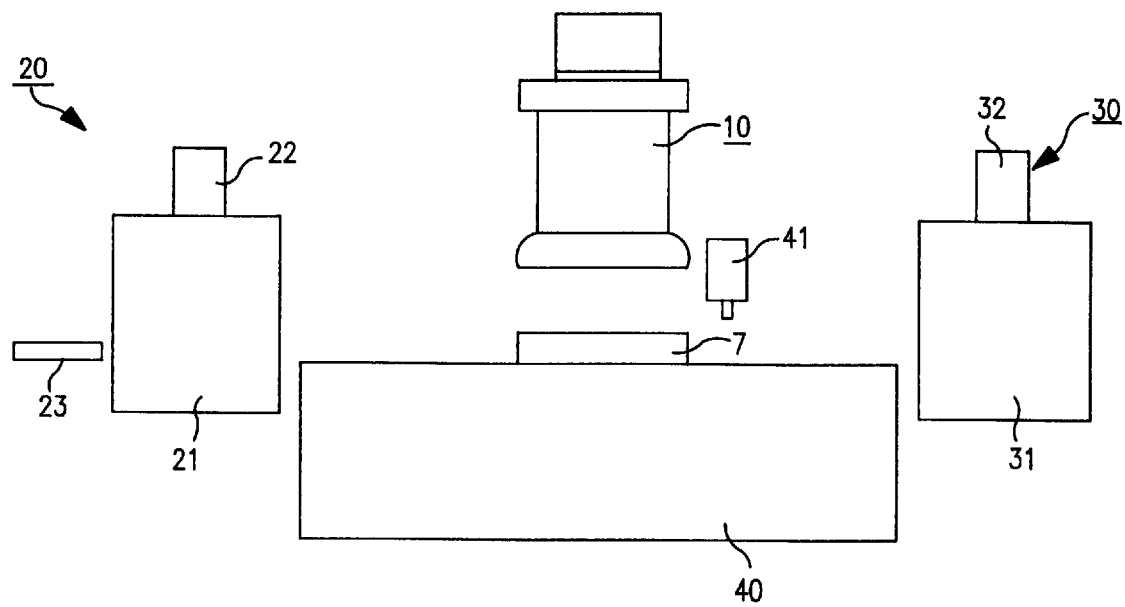
FIG. 5 is a front view of the prior art workpiece inspection apparatus.

As shown in FIG. 1, the workpiece inspection apparatus of the present invention includes a wire inspection device 10, loader-side and unloader side elevator 20 and 30, and a workpiece feeder 40 together with first and second marking units 42 and 43 which are respectively provided on either side of the wire inspection device 10. The remaining structure of the apparatus is substantially the same as the one shown in FIG. 5; accordingly, the same components are labeled with the same symbols, and a detailed description thereof is omitted.

Figure 2:
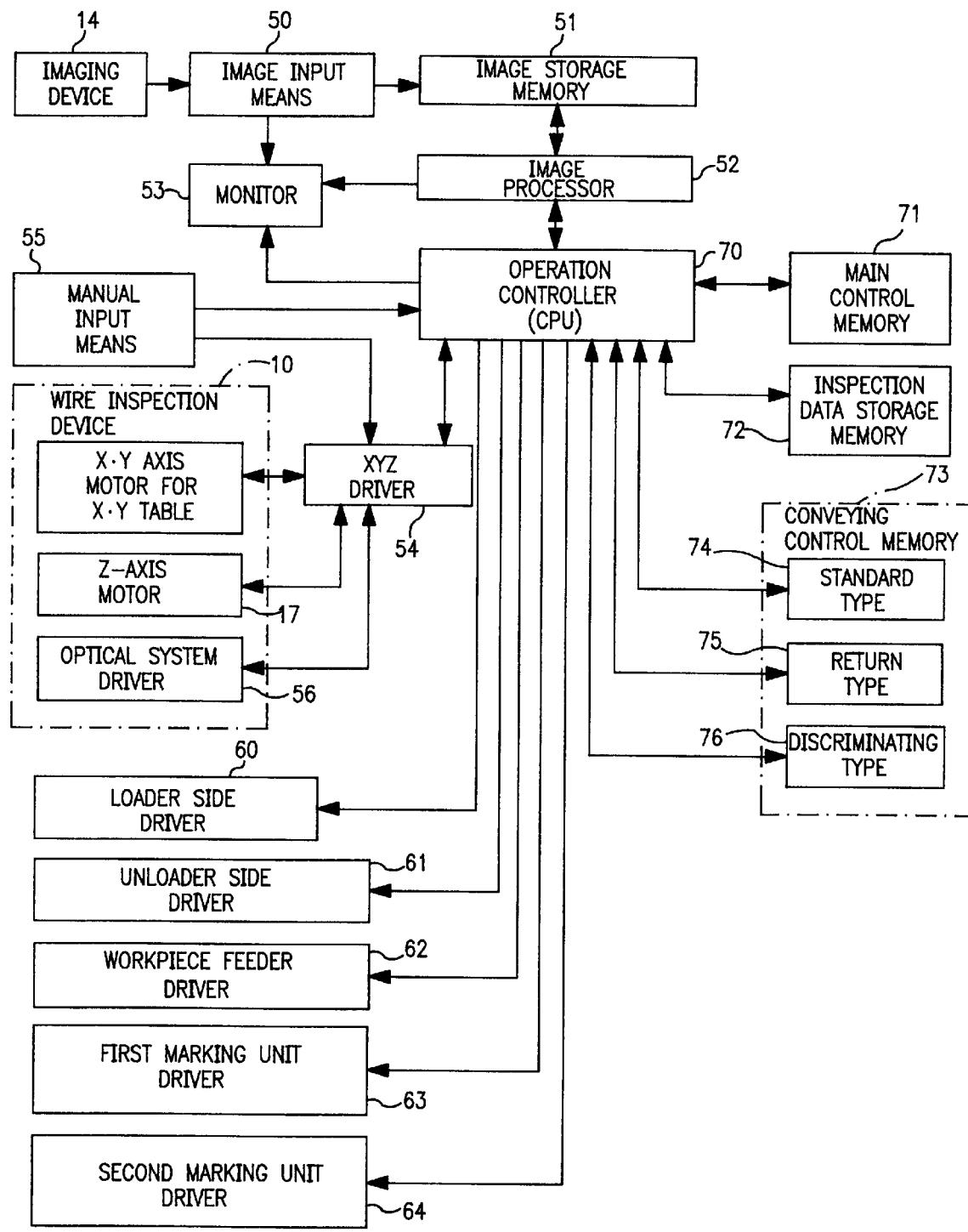
FIG. 2 is a block diagram which illustrates one embodiment of the control circuit of the workpiece conveying method of the present invention.
Figure 4:
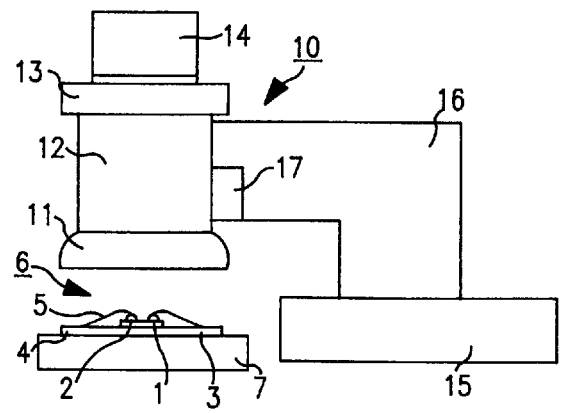
FIG. 4 is a schematic side view of the wire inspection device.

FIG. 2 shows a control circuit of the workpiece inspection apparatus shown in FIG. 1. As seen in FIG. 2, images obtained by the imaging device 14 of FIG. 4 are converted into digital signals by an image input means 50 and are stored in an image storage memory 51. The image patterns stored in this image storage memory 51 are subjected to image processing by an image processor 52, and the images are displayed on a monitor 53. The X-axis motor and Y-axis motor which drive the XY table 15 are controlled together with the Z-axis motor 17 by an XYZ driver 54. The XYZ driver 54 can be controlled directly by a manual input means 55 or by an operation controller 70. Furthermore, the setting of the optical system driver 56 that includes the illuminating means 11 and diaphragm means 13 of FIG. 4 is also controlled by the operation controller 70.

The operation controller 70 further controls a loader-side driver 60 which activates the loader-side motor 22 and loader-side pusher 23, an unloader-side driver 61 which activates the unloader-side motor 32, a workpiece feeder driver 62, and marker drivers 63 and 64 for the first and second marking units 42 and 43, respectively. Besides controlling the XYZ driver 54 and optical system driver 56 in accordance with procedures stored in a main control memory 71, the operation controller 70 calculates inspection values of the images processed by the image processor 52 and makes pass-fail judgements by comparing such values with inspection data stored in an inspection data storage memory 72.

Furthermore, a conveying control memory 73 stores control procedures that are used to control the driver 60 for the loader side 20, driver 61 for the unloader side 30, driver 62 for the workpiece feeder 40, and drivers 63 and 64 for the first and second marking units 42 and 43.

The following control procedures for three conveying types 74, 75 and 76 taken by the method and apparatus of the present invention are stored in this conveying control memory 73.

1. The first conveying type is a standard type 74 which is the same as that described in the "Prior Art" section. In this standard conveying type, workpieces which have been pushed out by the pusher 23 from the loader-side magazine 21 are brought underneath the inspection device 10 by the workpiece feeder 40 and inspected by the wire inspection device 10. When inspection is completed, the workpieces, defective ones and defect-free ones, are fed by the feeder 40 to and accommodated in the unloader-side magazine 31.

2. The second conveying type is a return type 75 which is the same as that described in the "Prior Art" section. In this return type conveyance, workpieces which have been pushed out by the pusher 23 from the loader-side magazine 21 are inspected by the wire inspection device 10 and then returned by the feeder 40 to and accommodated in the magazine 21.

3. The third conveying type is a discriminating type 76. In this type, workpieces which have been pushed out from the loader-side magazine 21 are inspected by the wire inspection device 10. If determined as defect-free, such workpieces are returned by the feeder 40 to the loader-side magazine 21 and accommodated therein, while workpieces determined as defective are fed by the feeder 40 and accommodated in the unloader-side magazine 31.

The components installed in the loader side 20, unloader side 30 and workpiece feeder 40 perform different operations depending upon which of the three conveying types is used. Control procedures of each the three conveying types are stored in the conveying control memory 73 by the manual input means 55 through the operation controller 70, and the selection of one of the three conveying types stored in the conveying control memory 73 is also accomplished through the manual input means 55 via the operation controller 70. In other words, the operation controller 70 controls the movements of the components of the loader side 20, unloader side 30, workpiece feeder 40 and first and second marking units 42 and 43 in accordance with the procedure for the conveying type selected from the three types stored in the conveying control memory.

The operation of the above embodiment will be described with reference to a bonded wire inspection and to FIGS. 1, 2 and 4. Since the wire inspection (e. g., inspection for positional discrepancies of the ball at the first bonding point, etc.) is well known, and since the wire inspection has no direct relevancy with the gist of the present invention, a description of the wire inspection itself will be omitted.

When one of the three conveying types 74, 75 and 76 stored in the conveying control memory 73 beforehand is selected, the loader-side magazine 21, unloader-side magazine 31 and workpiece feeder 40 are activated in accordance with the control procedure for the selected conveying type. The manner of pushing workpieces out onto the workpiece feeder 40 from the loader-side magazine 21 is common to any one of the conveying type selected. In other words, the feed-out of the workpieces 6 from the loader-side magazine 21 is accomplished by the operation of the loader-side pusher 23, but the feeding of the workpieces and the operation of the loader-side magazine 21 and unloader-side magazine 31 vary depending upon the selected conveying type.

In cases where the standard type 74 or discriminating type 76 is selected, the leading-end device part of each workpiece is first positioned in the inspection position of the inspection stand 7 and inspected. Then, when this inspection is completed, the next device part is positioned by the workpiece feeder 40 in the inspection position and inspected, and so on. In other words, the workpiece is fed toward the unloader side 30 so that inspection is successively performed from the leading end of the workpiece. Meanwhile, in cases where the return type 75 is selected, the trailing-end device part on each workpiece is positioned in the inspection position and inspected first. When this inspection is completed, the second device part from the trailing end of the workpiece is positioned in the inspection position and inspected, and so one. Thus, the workpiece is fed toward the loader side 20 so that inspection is successively performed from the trailing end of the workpiece 6. In the following more detailed description of the feeding of a workpiece to be inspected, the device parts of each workpiece will be referred to below as the "first device part". "second device part" and so on, according to the order in which the device parts are inspected.

Figure 3:
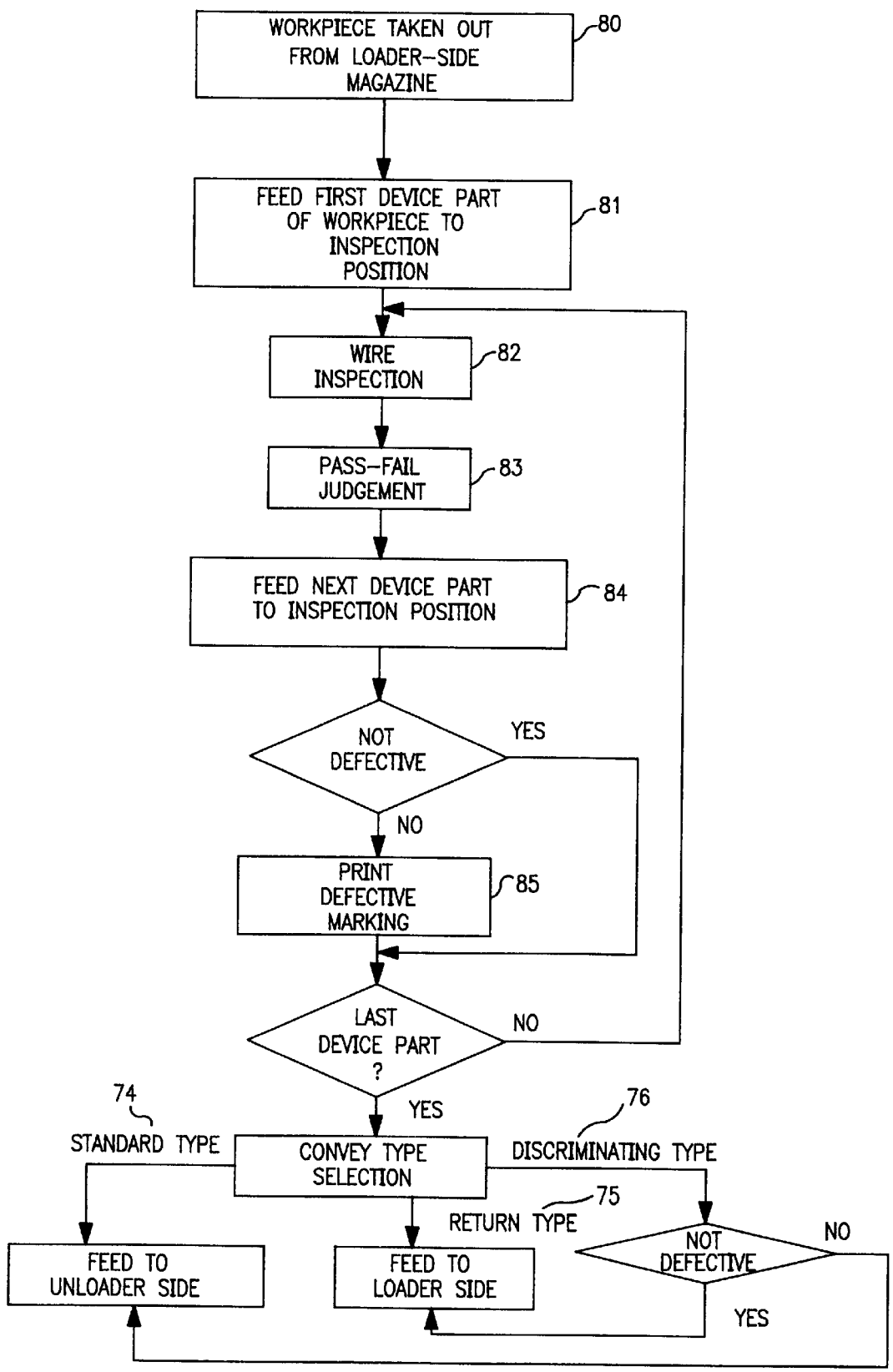
FIG. 3 is a flow chart of the operation steps of the workpiece conveyance according to the present invention.

After a workpiece upon which wire bonding has been executed is pushed out from the loader-side magazine 21 at step 80 in FIG. 3, the first device part of this workpiece is fed at step 81 to the inspection position and positioned in the inspection position. A wire inspection is performed at step 82 by the wire inspection device 10, and a pass-fail judgement is made by the operation controller 70 at step 83. Since, the first and second marking units 42 and 43 are separated from the inspection position of the wire inspection device 10 by a distance which is equal to the fixed pitch of the device parts of a workpiece, when the workpiece is fed one pitch by the workpiece feeder 40 so that the next device part is fed at step 84 to the inspection position, the first device part is positioned beneath the first marking unit 42 in the standard type 74 or discriminating type 76 and is positioned beneath the second marking unit 43 in the case of the return type 75. Then, if the first device part has been judged to be defective at step 83 which is a pass-or-fail judgement step operated by the operation controller 70, the first marking unit 42 or second marking unit 43 is actuated so that a "defective" mark is printed on the device part by the marking units at step 85.

In this way, the respective device parts are successively inspected. When inspections till the last device part of the workpiece is completed, an operation which accommodates the inspected workpiece is performed by the workpiece feeder 40. In the standard type 74, the inspected workpiece is fed to the unloader side 30 and accommodated in the unloader-side magazine 31. In the return type 75, the inspected workpiece is fed to the loader side 20 and accommodated in the loader-side magazine 21. In the discriminating type 76, the inspected workpiece is fed back to the loader side 20 and accommodated in the loader-side magazine 21 if the workpiece is free of defects but is fed to the unloader side 30 and accommodated in the unloader-side magazine 31 if the workpiece is defective.

In the standard type 74, each time the workpiece is fed out from the loader-side magazine 21 as described above, the loader-side magazine 21 is lowered one pitch by the loader-side motor 22, so that the next workpiece inside the loader-side magazine 21 is positioned at the conveying level of the feeder 40. Furthermore, each time a workpiece is accommodated in the unloader-side magazine 31, the unloader-side magazine 31 is lowered one pitch by the unloader-side motor 32, so that the next accommodating section of the magazine 31 is positioned at the conveying level of the feeder 40.

In the case of the return type 75, each workpiece to be inspected is pushed out from the loader-side magazine 21, and the loader-side magazine 21 is not raised or lowered until the workpiece is fed back so as to be accommodated inside the loader-side magazine 21 after being inspected. Then, the loader-side magazine 21 is lowered one pitch by the loader-side motor 22 when the inspected workpiece has been accommodated in the magazine 21.

In the case of the discriminating type 76, the loader-side magazine 21 functions more or less in the same manner as in the return type 75. In other words, after a defect-free workpiece is accommodated in the loader-side magazine 21, or after a defective workpiece is accommodated in the unloader-side magazine 31, the loader-side magazine 21 is lowered one pitch so that the next workpiece is positioned at the conveying level, and each time a defective workpiece is accommodated in the unloader-side magazine 31, the unloader-side magazine 31 is lowered one pitch so that the magazine 31 is ready to receive the next workpiece.

Thus, in cases where the discriminating type 76 is selected, defect-free workpieces are accommodated in the loader-side magazine 21, and defective workpieces are accommodated in the unloader-side magazine 31. In other words, only defect-free workpieces are accommodated in the loader-side magazine, and there is no need to investigate and separate defective workpieces in subsequent processes. Furthermore, since the defect-free workpieces are accommodated back in the loader-side magazine 21, there is no need for making a magazine registration change.

In the above, control procedures for three conveying types, i. e., the standard type 74, return type 75 and discriminating type 76, are stored in the conveying control memory 73 so that a desired conveying type can be selected in accordance with the production line involved. Accordingly, the method and apparatus of the present invention has sufficient flexibility to be used and handle different production lines.

Furthermore, in the return type 75, inspection starts from the trailing end of each workpiece. However, it can be designed so that the inspection starts from the leading end of each workpiece in the return type 75 as in the standard type 74 and discriminating type 76. When this leading-end-first inspection is done, marking of the workpieces is executed so that defective workpieces are marked with "defective" markings by the first marking unit 42 as in the standard type 74 and discriminating type 76.

Furthermore, in the above embodiment, inspection is made on bonded wires. However, the present invention is not limited to this application. For example, the present invention can be widely used in other applications such as inspection of the bonding positions of die-bonded chips and inspection of the bonding positions of leads in chip-mounted chips, etc. In such cases, it goes without saying that a workpiece inspection apparatus suited to the object of inspection is used instead of the wire inspection device 10.

As seen from the above, according to the present invention, workpieces accommodated in a loader-side magazine are fed to an inspection position and inspected by a workpiece inspection device; and workpieces which are found to be free of defects are fed so that the workpieces are accommodated back in the original loader-side magazine, while workpieces which are found to be defective are fed so that the defective workpieces are accommodated in an unloader-side magazine. Accordingly, subsequent processes do not need to do detection and separation of defect-free and defective workpieces.

Furthermore, according to the present invention, three different conveying types of workpiece conveyances are selectively performed, which are: a standard type in which workpieces accommodated in a loader-side magazine are fed to an inspection position and inspected by the inspection device so that workpieces found to be defective are marked with a "defective" marking, and all of the inspected workpieces are fed and accommodated in the unloader-side magazine; a return type in which all of the inspected workpieces (including both defective and defect-free workpieces) are fed back and accommodated in the loader-side magazine; and a discriminating type in which workpieces free of defects are fed to and accommodated in the original loader-side magazine, while defective workpieces are fed to and accommodated in the unloader-side magazine. Accordingly, the present invention has a wide flexibility required in order to handle diversified production lines.

We claim:

1. A workpiece inspection apparatus comprising: a workpiece inspection device which inspects workpiece upon which bonding has been performed, a loader-side magazine and an unloader-side magazine which are respectively provided on either side of said workpiece inspection device and held by elevators that move upward and downward, and a workpiece feeder which is installed between said loader-side magazine and said unloader-side magazine so as to convey workpiece to and from an inspection position of said workpiece inspection device, said apparatus further comprising a workpiece inspection memory and an arithmetic means coupled to said workpiece inspection memory wherein, said workpiece inspection memory stores a control procedure for controlling conveyance of inspected workpieces such that workpiece that have been inspected and found to be free of defects by said inspection device are returned to said loader-side magazine and accommodated in said loader-side magazine, while workpiece that have been inspected and found to be defective by said inspection device are conveyed by said feeder and accommodated in said unloader-side magazine, and said arithmetic means controls said loader side magazine, said unloader side magazine and said workpiece feeder in accordance with said control procedure stored in said workpiece inspection memory.

2. A workpiece inspection apparatus comprising: a workpiece inspection device which inspects workpiece upon which bonding has been performed, a loader-side magazine and an unloader-side magazine which are respectively provided on either side of said workpiece inspection device and held by elevators that move upward and downward, and a workpiece feeder which is installed between said loader-side magazine and said unloader-side magazine so as to convey workpiece to and from an inspection position of said workpiece inspection device, said workpiece inspection apparatus further comprising a conveying control memory and an arithmetic means coupled to said conveying control memory wherein, said conveying control memory stores control procedures of each one of three workpiece conveying methods including a first method in which inspected workpieces are fed to and accommodated in said unloader-side magazine, a second method in which inspected workpieces are fed back to and accommodated in said loader-side magazine, and a third method in which inspected workpieces which are free of defects are conveyed back by said workpiece feeder and accommodated in said loader-side magazine while inspected workpieces which are defective are conveyed by said workpiece feeder and accommodated in said unloader-side magazine, and said arithmetic means controls said loader-side magazine, said unloader-side magazine and said workpiece feeder in accordance with a control procedure of one of said three workpiece conveying methods which is selected from said three methods stored in said conveying control memory.

* * * * *